US012805056B2

(12) United States Patent
Helmers et al.

(10) Patent No.: US 12,805,056 B2
(45) Date of Patent: Nov. 17, 2026

(54) METHOD FOR PRODUCING AT LEAST ONE PHOTOVOLTAIC CELL FOR CONVERTING ELECTROMAGNETIC RADIATION INTO ELECTRICAL ENERGY

(71) Applicant: Fraunhofer-Gesellschaft zur Förderung der angewandten Forschung e.V., Munich (DE)

(72) Inventors: Henning Helmers, Freiburg (DE); Oliver Höhn, Freiburg (DE); David Lackner, Freiburg (DE); Felix Predan, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 370 days.

(21) Appl. No.: 18/569,659

(22) PCT Filed: Jun. 8, 2022

(86) PCT No.: PCT/EP2022/065460
§ 371 (c)(1),
(2) Date: Dec. 13, 2023

(87) PCT Pub. No.: WO2022/263240
PCT Pub. Date: Dec. 22, 2022

(65) Prior Publication Data

US 2024/0282872 A1 Aug. 22, 2024

(30) Foreign Application Priority Data

Jun. 14, 2021 (DE) ......................... 102021115260.7

(51) Int. Cl.
*H10F 71/00* (2025.01)
*H10F 19/75* (2025.01)
(Continued)

(52) U.S. Cl.
CPC ........... *H10F 77/169* (2025.01); *H10F 19/75* (2025.01); *H10F 71/00* (2025.01); *H10F 77/488* (2025.01); *H10F 77/937* (2025.01)

(58) Field of Classification Search
CPC .. H10F 10/163; H10F 71/127; H10F 71/1272; H10F 71/413; H10F 71/488; H10F 71/137; H10F 77/413; H10F 77/488
See application file for complete search history.

(56) References Cited

U.S. PATENT DOCUMENTS

2002/0135035 A1 9/2002 Yamaguchi et al.
2015/0340534 A1* 11/2015 Guter .................... H10F 10/142 136/249
(Continued)

FOREIGN PATENT DOCUMENTS

DE 3511082 C2 3/1989
JP 2014093399 A 5/2014

OTHER PUBLICATIONS

Karlina L B et al: "Progress in Narrow Gap INGAAS/INP Element for Tandem Solar Cells", World Conference on Photovoltaic Energy. Waikoloa, Dec. 5-9, 1994; [World Conference on Photovoltaic Energy], New York, IEEE, US, vol. CONF. 1, pp. 1918-1921, Dec. 5, 1994 (Dec. 5, 1994).
(Continued)

*Primary Examiner* — Reema Patel
(74) *Attorney, Agent, or Firm* — Volpe Koenig

(57) ABSTRACT

A method for producing at least one photovoltaic cell for converting electromagnetic radiation into electrical energy, having the method steps of: A. providing a superstrate in the form of a semiconductor substrate; B. applying photovoltaic cell semiconductor layers for forming at least one photovoltaic cell to a rear face of the superstrate indirectly or directly, and the photovoltaic cell semiconductor layers have at least one absorber layer formed from a direct semicon-
(Continued)

ductor. The superstrate is in the form of a current conducting layer having a thickness greater than 10 μm and, in method step B, the photovoltaic cell semiconductor layers are formed with an electrically conductive connection to the current conducting layer and wherein the band gap of the current conducting layer is larger by at least 50 meV than the band gap of the absorber layer.

18 Claims, 4 Drawing Sheets

(51) Int. Cl.

| | |
|---|---|
| ***H10F 77/00*** | (2025.01) |
| ***H10F 77/169*** | (2025.01) |
| ***H10F 77/42*** | (2025.01) |

(56) References Cited

U.S. PATENT DOCUMENTS

| | | | | |
|---|---|---|---|---|
| 2017/0018675 | A1 | 1/2017 | Meitl et al. | |
| 2018/0062017 | A1 * | 3/2018 | Derkacs | H10F 19/902 |
| 2018/0182912 | A1 | 6/2018 | Choi et al. | |
| 2020/0185558 | A1 * | 6/2020 | Dong | H10F 77/1248 |
| 2021/0020798 | A1 * | 1/2021 | Cardwell | H10F 10/144 |
| 2021/0066521 | A1 * | 3/2021 | Iguchi | H10F 39/103 |

OTHER PUBLICATIONS

Andreev V M et al: Narrow Gap InGaAs/InP Solar Cells Illuminated Through Transparent InP Substrate, 12th. E.C. Photovoltaic Solar Energy Conference. Amsterdam, The Netherlands, Apr. 11-15, 1994; [Proceedings of the International Photovoltaic Solar Energy Conference], Bedford H.S. Stephens & Associates, GB, vol. CONF. 12, pp. 1398-1400, Apr. 11, 1994 (Apr. 11, 1994).

C. Algora, "Very-High-Concentration Challenges of III-V Multijunction Solar Cells," in Springer Series in Optical Sciences, Concentrator Photovoltaics, A. L. Luque and V. M. Andreev (editors), Berlin Heidelberg: Springer, pp. 89-111, 2007.

M. Steiner, S. P. Philipps, M. Hermle, A. W. Bett, F. Dimroth, "Validated front contact grid simulation for GaAs solar cells under concentrated sunlight," Progress in Photovoltaics: Research and Applications, vol. 19, No. 1, pp. 73-83, 2010.

Materials Science Reports, vol. 7, issue 3, pp. 87-142, Dislocations in strained-layer epitaxy: theory, experiment, and applications, E. A. Fitzgerald, https://doi.org/10.1016/0920-2307(91)90006-9, Nov. 1991.

M. T. Bulsara, C. Leitz, and A. Fitzgerald, "Relaxed InGaAs graded buffers grown with organometallic vapor phase epitaxy on GaAs," Appl. Phys. Lett., vol. 72, pp. 1608-1610, Mar. 30, 1998.

Relaxed, high-quality InP on GaAs by using InGaAs and InGaP graded buffers to avoid phase separation, Journal of Applied Physics 102, 033511 (2007), https://doi.org/10.1063/1.2764204, Aug. 10, 2007.

France et al. (IEEE Journal of Photovoltaics, vol. 6, No. 2, Design Flexibility of Ultrahigh Efficiency Four-Junction Inverted Metamorphic Solar Cells, Ryan M. France, John F. Geisz, Ivan Garcia, Myles A. Steiner, William E. McMahon, Daniel J. Friedman, Tom E. Moriarty, Carl Osterwald, J. Scott Ward, Anna Duda, Michelle Young, and Waldo J. Olavarria), pp. 578-583, Mar. 2016.

Zuehlke et al.,"TLS-Dicing—An innovative alternative to known technologies", pp. 28-32, https://doi.org/10.1109/ASMC.2009.5155947), 2009.

F. Fukuyo, K. Fukumitsu and N. Uchiyama, "Stealth dicing technology and applications", Proc. 6th Int. Symp. Laser Precision Microfabrication, Hamamatsu, Mar. 2005.

Kumagai et al., "Advanced Dicing Technology for Semiconductor Wafer—Stealth Dicing", IEEE T Semiconductor Manufacturing, vol. 20, No. 3, https://doi.org/10.1109/TSM.2007.901849), Aug. 2007.

Vurgaftman, J. R. Meyer, and L. R. Ram-Mohan, "Band parameters for III-V compound semiconductors and their alloys," J. Appl. Phys. 89, pp. 5815-5875, Jun. 1, 2001.

Wheeldon et al., "Performance Comparison of AlGaAs, GaAs, amd InGaP tunnel junctions for concentrated multijunction solar cells", Progress in Photovoltaics: Research and Applications, Prog. Photovolt: Res. Appl. 2011; 19:442-452, published in Wiley Online Library (wileyonlinelibrary.com). DOI: 10.1002/pip.1056, Nov. 18, 2010.

* cited by examiner

METHOD FOR PRODUCING AT LEAST ONE PHOTOVOLTAIC CELL FOR CONVERTING ELECTROMAGNETIC RADIATION INTO ELECTRICAL ENERGY

CROSS-REFERENCE TO RELATED APPLICATIONS

This application is a 371 National Phase of PCT/EP2022/065460, filed Jun. 8, 2022, which claims priority to German Patent Application No. 10 2021 115 260.7, filed Jun. 14, 2021. Both of which are incorporated herein by reference as if fully set forth.

TECHNICAL FIELD

The invention relates to a method for producing at least one photovoltaic cell for converting electromagnetic radiation into electrical energy.

BACKGROUND

The use of photovoltaic cells to convert incident electromagnetic radiation into electrical energy is known. Depending on the application, photovoltaic cells are also referred to as solar cell (especially for converting sunlight into electrical energy), photonic power converters, laser power converters, photovoltaic power converters or phototransducers.

In optical power transmission systems, photovoltaic cells are used to convert electromagnetic radiation, generated by a radiation source, into electrical energy. Here, the efficiency of the photovoltaic cell plays an essential role in the overall efficiency of the system.

Typical photovoltaic cells in such systems have an absorber layer which is formed from a direct semiconductor and which, compared to a layer formed from an indirect semiconductor, is distinguished by considerably higher absorption of the incident radiation at the same thickness of the absorber layer.

Typical photovoltaic cells for conversion of incident electromagnetic radiation into electrical energy that are used in systems for optical power and/or signal transmission have metallic contact structures on a front face facing the incident radiation for conducting away charge carriers.

Two opposing effects must be taken into account when configuring said metallic contact structure: Firstly, a high degree of coverage of the front face by the metallic contacting structure is desirable in order to reduce series resistance losses. Secondly, radiation is not coupled into the photovoltaic cell on the front face that is covered by the metallic contacting structure, thus resulting in optical losses. This results in a known optimization problem that occurs with typical photovoltaic cells.

Moreover, the relevance of the aforementioned losses increases with the power impinging on the photovoltaic cell, since the power loss increases quadratically with the expected photocurrent of the photovoltaic cell.

SUMMARY

It is therefore an object of the present invention to provide a method for producing at least one photovoltaic cell for converting electromagnetic radiation into electrical energy that allows cost-efficient production of photovoltaic cells with little shading of the photovoltaic cell and thus high coupling-in of light with, at the same time, low series resistance losses when conducting away charge carriers on the front face of the photovoltaic cell.

This object is achieved by a method for producing at least one photovoltaic cell for converting electromagnetic radiation into electrical energy having one or more of the features described herein. Advantageous configurations can be found in the description and claims.

The optimization problem mentioned at the start in configuring a metallic contacting structure on the front face of a photovoltaic cell has hitherto been solved by minimizing the total losses, taking into account the operating conditions of the photovoltaic cell, in particular the photogenerated current and the distribution of the current flows within the photovoltaic cell. This involved optimizing the amount, in particular thickness, and disposition of the metallic contacting structure.

Typical metallization structures therefore have a so-called comb structure in which, starting from a straight busbar having a relatively high cross-sectional area, parallel metal fingers having a relatively small cross-sectional area extend perpendicular to the busbar. What are known in the case of photovoltaic cells in which electromagnetic radiation impinges in a defined receiving region, in particular photovoltaic cells for use in power transmission in combination with a radiation source or concentrator photovoltaic cells, are busbars, including continuously peripheral busbars, in particular annular busbars, that are disposed outside the receiving region, with the metal fingers, starting from the busbars, extending into the area enclosed by the busbar.

Examples of results of such optimization of the metallic contacting structures are stated, for example, in C. Algora, "Very-High-Concentration Challenges of III-V Multijunction Solar Cells," in Springer Series in Optical Sciences, Concentrator Photovoltaics, A. L. Luque and V. M. Andreev (editors), Berlin Heidelberg: Springer, 2007, pp. 89-111 and M. Steiner, S. P. Philipps, M. Hermle, A. W. Bett, F. Dimroth, "Validated front contact grid simulation for GaAs solar cells under concentrated sunlight," Progress in Photovoltaics: Research and Applications, vol. 19, no. 1, pp. 73-83, 2010.

The present invention is based on the finding that the degree of coverage with which a front face of a photovoltaic cell facing the incident radiation is covered by a metallic contacting structure can be considerably reduced by providing nonmetallic elements having good electrical transverse conductivity that, parallel to the front face, have high electrical conductivity and high transparency to the electromagnetic radiation to be converted compared to the metallic contacting structure. Therefore, according to the invention, a semiconductor current conducting layer having a large thickness compared to previously known layer structures is provided.

However, depositing a semiconductor layer of large thickness onto a semiconductor structure is a cost-intensive method step. Therefore, according to the invention, the photovoltaic cell is produced in a superstrate configuration: In contrast to the substrate configuration that is typically used, the superstrate configuration involves producing the solar cell starting from the front face facing the incident radiation. The substrate on which the layers for forming the photovoltaic cell are applied is thus situated on the front face of the photovoltaic cell in later use and is therefore referred to as a superstrate and simultaneously performs the function of the aforementioned semiconductor current conducting layer.

The method according to the invention for producing at least one photovoltaic cell for converting electromagnetic radiation into electrical energy has the following method steps:

A. providing a superstrate in the form of a semiconductor substrate;

B. applying photovoltaic cell semiconductor layers for forming photovoltaic cells to a rear face of the superstrate indirectly or directly, wherein the photovoltaic cell semiconductor layers have at least one absorber layer formed from a direct semiconductor;

wherein the superstrate is in the form of a current conducting layer having a thickness greater than 10 μm and, in method step B, the photovoltaic cell semiconductor layers are formed with an electrically conductive connection to the current conducting layer, wherein a metamorphic buffer structure having one or more buffer layers is disposed between the current conducting layer and the photovoltaic cell semiconductor layers, and wherein the band gap of the current conducting layer and the band gap of the buffer layer is larger by at least 10 meV, in particular at least 50 meV, preferably at least 100 meV, than the band gap of the absorber layer.

According to the invention, a metamorphic buffer structure is disposed between the current conducting layer and the photovoltaic cell semiconductor layers. Such a buffer structure allows gradual adjustment of the lattice constant between the current conducting layer and the front-face-disposed layer of the photovoltaic layer structure. This has the advantage that crystal defects such as penetrative dislocations within the photovoltaic layer structure can be reduced. A metamorphic buffer structure per se is known in photovoltaic cells having direct absorber layers and is described, for example, in Materials Science Reports, volume 7, issue 3, November 1991, pages 87-142, Dislocations in strained-layer epitaxy: theory, experiment, and applications, E. A. Fitzgerald, https://doi.org/10.1016/0920-2307(91)90006-9, M. T. Bulsara, C. Leitz, and A. Fitzgerald, "Relaxed InGaAs graded buffers grown with organometallic vapor phase epitaxy on GaAs," Appl. Phys. Lett., vol. 72, pp. 1608-1610, 1998, and Relaxed, high-quality InP on GaAs by using InGaAs and InGaP graded buffers to avoid phase separation, Journal of Applied Physics 102, 033511 (2007), https://doi.org/10.1063/1.2764204.

A photovoltaic cell formed by means of the method according to the invention is thus distinguished by the fact that electromagnetic radiation for conversion into electrical energy is efficiently absorbed by means of the absorber layer formed from a direct semiconductor, that the current conducting layer having a thickness greater than 10 μm and formed from a semiconductor material allows electrical transverse conduction of charge carriers and that, owing to the different band gaps of the current conducting layer and the absorber layer, absorption of incident electromagnetic radiation in the current conducting layer can be avoided or at least an optimization with respect to a specified incident electromagnetic radiation with a specified spectrum is possible, and so absorption takes place substantially in the absorber layer and not in the current conducting layer or only negligibly therein.

Owing to the transverse conduction of charge carriers in the current conducting layer on the front face of the photovoltaic cell, the function of the metallic contacting structure on the front face of previously known photovoltaic cells is thus at least partially assumed by the current conducting layer in the present photovoltaic cell according to the invention, thus allowing a reduction in the metallic contacting structure, in particular a reduction in the degree of coverage of the front face of the photovoltaic cell with a metallic contacting structure, without considerable losses due to series resistance effects.

Furthermore, the method according to the invention is particularly cost-efficient:

As described above, the production of photovoltaic cells, in particular monolithic photovoltaic cells, typically requires a substrate to which the layers of the photovoltaic cell are applied, typically epitaxially applied. However, applying a thick layer such as the current conducting layer is a cost-intensive method step.

The method according to the invention has the advantage of using a superstrate which, as a current conducting layer, is part of the photovoltaic cell, and so the current conducting layer does not have to be applied, in particular epitaxially applied. The superstrate is situated on the side of the photovoltaic cell semiconductor layers facing the incident radiation during use of the photovoltaic cell.

Advantageously, the current conducting layer, the metamorphic buffer structure and the photovoltaic cell semiconductor layers are monolithically formed. This results in a robust structure, and method steps for joining individual components are avoided. It is therefore advantageous that metamorphic buffer structure and the photovoltaic cell semiconductor layers are generated on the superstrate. This dispenses with the complexity of transferring these elements from a forming substrate to the current conducting layer. In a preferred configuration that is particularly convenient, metamorphic buffer structure and the photovoltaic cell semiconductor layers are deposited on the superstrate, in particular preferably epitaxially deposited, preferably by means of CVD (chemical vapor deposition).

In order to ensure transverse conductivity of the current conducting layer, the current conducting layer preferably has doping with a dopant of the n-doping type or the opposite p-doping type. The doping concentration is preferably greater than $10^{16}$ $cm^{-3}$, more preferably greater than $5\times10^{16}$ $cm^{-3}$, in particular greater than $10^{17}$ $cm^{-3}$.

In particular, it is advantageous to use a GaAs layer, preferably an n-doped gallium arsenide superstrate, as the current conducting layer. Here, the n-doping of the superstrate is preferably in the range from $1\times10^{16}$ $cm^{-3}$ to $5\times10^{18}$ $cm^{-3}$, in particular in the range from $5\times10^{16}$ $cm^{-3}$ to $3\times10^{17}$ $cm^{-3}$.

In an advantageous embodiment, the current conducting layer has a doping concentration less than $10^{19}$ $cm^{-3}$, preferably less than $5\times10^{18}$ $cm^{-3}$, in particular less than $5\times10^{17}$ $cm^{-3}$. The absorption of free charge carriers by a doped semiconductor layer depends on the doping. Lower doping thus leads to lower absorption in the current conducting layer compared to higher doping.

The photovoltaic cell produced by means of the method according to the invention is usable as previously known photovoltaic cells. However, it is particularly advantageous to use the photovoltaic cell according to the invention in combination with spatially confined electromagnetic radiation, in particular focused and/or concentrated radiation.

It is particularly advantageous to use the photovoltaic cell according to the invention in a transmission system for energy and/or signal transmission by means of electromagnetic radiation.

Such systems have at least one radiation source for generating electromagnetic radiation. The radiation of the radiation source impinges at least partially on a receiving region of a photovoltaic cell of the transmission system, so that energy and/or signals can be transmitted by means of the electromagnetic radiation. As described above, the receiving region is the region of the surface of the solar cell in which the incident radiation impinges, or at least the energetically significant component of the incident radiation.

In the case of use in such transmission systems, the spectrum of the radiation source is typically known. Such a spectrum typically has a narrower band than the solar spectrum, i.e., it has a smaller width of the spectral distribution (full width at half maximum, FWHM). A common characteristic of such a spectrum is the dominant photon energy, i.e., the energy value in the spectrum at which the largest number of photons is emitted.

Therefore, it is advantageous to optimize the conversion of electromagnetic radiation into electrical energy with respect to the intensity and spectrum of the electromagnetic radiation of the radiation source. In particular, preference is given to optimizing the band gaps of the superstrate and the absorber layer depending on a specified dominant photon energy.

It is therefore advantageous that the superstrate has a band gap which is larger, in particular by 10 meV to 500 meV, than a specified dominant photon energy and that the absorber layer is formed with a band gap which is smaller, in particular by 1 meV to 150 meV, preferably by 10 meV to 80 meV, than the dominant photon energy.

It is therefore especially advantageous that the superstrate has a band gap which is larger, in particular by a value in the range from 51 meV to 650 meV, preferably in the range from 60 meV to 580 meV, than the band gap of the absorber layer.

Starting from radiation sources for typical applications of a transmission system, the specified dominant photon energy is preferably in the range between 0.5 eV and 2.5 eV, particularly preferably in the range between 0.74 eV and 1.55 eV, especially in one of the ranges of from 1.38 eV to 1.55 eV, from 1.13 eV to 1.38 eV, from 0.88 eV to 1.00 eV and from 0.74 eV to 0.88 eV.

In particular, it is advantageous to form the absorber layer with materials depending on the specified range of the dominant photon energy, according to the following table:

| Range of dominant photon energy | Material of absorber layer |
|---|---|
| 1.38 eV to 1.55 eV | GaAs, AlGaAs, GaInAsP |
| 1.38 eV to 1.55 eV or 1.13 eV to 1.38 eV or 0.88 eV to 1.00 eV or 0.74 eV to 0.88 eV | GaInAs or InGaAsP or AlInGaAs |

The width of the specified spectral distribution (FWHM) is smaller than 150 nm for typical radiation sources.

As explained above, the current conducting layer at least partially assumes the function of a metallic contact structure in previously known photovoltaic cells owing to the transverse conductivity for charge carriers. To interconnect the photovoltaic cell with an external circuit and/or to support the transverse conductivity of the current conducting layer, it is advantageous when a metallic front-face contacting structure is formed on a front face of the superstrate, which contacting structure is disposed on the front face of the superstrate indirectly or directly and is electrically conductively connected to the superstrate. The front face of the superstrate is the side of the superstrate facing away from the photovoltaic semiconductor layers.

The current conducting layer preferably has a receiving region, as described above, for receiving incident electromagnetic radiation. The metallic front-face contacting structure is preferably designed in such a way that the degree of coverage of the front-face contacting structure in the receiving region is <5%, in particular <3%, preferably <1%, more preferably <0.2%. If a significant portion of the incident electromagnetic radiation impinges on the current conducting layer in the receiving region, there is thus only little shading of the incident electromagnetic radiation by the front-face contacting structure. By contrast, coverage of the current conducting layer with the metallic front-face contacting structure outside the receiving region leads to no losses or only negligible losses due to shading of the incident electromagnetic radiation.

In particular, it is therefore advantageous that the metallic front-face contacting structure is formed so as to have metallic contacting elements on one side or preferably multiple sides of the receiving region. In particular, it is advantageous that the metallic front-face contacting structure is formed with a metallic contacting element which is formed around the edge of the receiving region. Said metallic contacting elements on the sides or around the edge of the receiving region can thus have a high cross-sectional area comparable to previously known busbars.

The receiving region is preferably designed in such a way that it covers a circular area having an area in the range from 0.01 $cm^2$ to 1 $cm^2$. In particular, it is advantageous to design the receiving region circularly.

Advantageously, a mirror structure for at least partial reflection of the electromagnetic radiation is disposed indirectly or directly on a rear face of the photovoltaic layer structure facing away from the current conducting layer. The mirror structure is electrically conductive, and so charge carriers can be conducted away via the mirror structure on the rear face. In particular, it is advantageous that one element or multiple elements from the group consisting of: a metal layer, in particular silver layer or gold layer; a dielectric layer structure having at least one dielectric layer and at least one metal layer; and a Bragg mirror (distributed Bragg reflector); is/are used to form the mirror structure.

The method according to the invention has the advantage that the photovoltaic cell semiconductor layers do not have to be detached from a substrate; instead, they are applied on the superstrate which is in the form a current conducting layer and which is thus a functional part of the photovoltaic cell.

This is advantageous especially in the case of the above-described advantageous configuration with disposition of a mirror structure, since the mirror structure the mirror structure is applied after detachment of the solar cell from the substrate in the case of the typical, previously known production of a photovoltaic cell having a mirror structure, thus requiring the involvement of special requirements for the detachment process. By contrast, in the case of the present production of the photovoltaic cell in a superstrate configuration, the layers are produced "from top to bottom", i.e., starting with the layers lying on the front face and detachment is not necessary, and so there are no restrictions on forming the mirror structure.

An optically reflective and, at the same time, electrically conductive rear face has the advantage that, firstly, electromagnetic radiation which was initially not absorbed in the photovoltaic layer structure is at least partially reflected by the mirror structure and these radiation components can thereby still be absorbed in the absorber layer. Moreover, in the case of very thin absorber layers (a few micrometers, in particular a few 100 nanometers, up to less than 100 nanometers), an increase in the degree of absorption can be achieved with a suitable design of the photovoltaic cell semiconductor layers through a rear face which is reflective and preferably also optical scattering, optical diffracting or light-deflecting in some other way. Furthermore, the electrical conductivity allows charge carriers to be conducted away, as known per se, on the rear face of the layer structure.

The metamorphic buffer structure is preferably formed with a band gap which decreases starting from the current conducting layer in the direction of the photovoltaic cell semiconductor layers. In an advantageous configuration, the metamorphic buffer structure has a buffer layer with a band gap which decreases continuously, in particular decreases strictly monotonically.

In a further advantageous configuration, the metamorphic buffer structure has multiple buffer layers, wherein the buffer layers have band gaps which decrease starting from the current conducting layer in the direction of the photovoltaic cell semiconductor layers. Advantageously, the individual buffer layers are formed with a constant band gap, so that a stepped decrease in the band gap in the buffer structure in the direction of the photovoltaic cell semiconductor layers is formed. It is also within the scope of the invention that one or more buffer layers of the metamorphic buffer structure have a band gap which decreases continuously, in particular decreases strictly monotonically.

The metamorphic buffer structure is preferably formed with a lattice constant which increases starting from the current conducting layer in the direction of the photovoltaic cell semiconductor layers. In an advantageous configuration, the metamorphic buffer structure has a buffer layer with a lattice constant which increases continuously, in particular increases strictly monotonically.

In a further advantageous configuration, the metamorphic buffer structure has multiple buffer layers, wherein the buffer layers have lattice constants which increase starting from the current conducting layer in the direction of the photovoltaic cell semiconductor layers. Advantageously, the individual buffer layers are formed with a constant lattice constant, so that a stepped increase in the lattice constant in the buffer structure in the direction of the photovoltaic cell semiconductor layers is formed. It is also within the scope of the invention that one or more buffer layers of the metamorphic buffer structure have a lattice constant which increases continuously, in particular increases strictly monotonically.

Advantageously, the metamorphic buffer structure on the side facing the photovoltaic cell semiconductor layers has an excess layer which has a larger lattice constant than the subsequent photovoltaic cell semiconductor layers. Preferably, the excess layer is directly adjacent to the photovoltaic cell semiconductor layers.

The specific thickness of the buffer structure indicates the ratio of the thickness of the buffer structure in nanometers to the deviation of the lattice constant in picometers between superstrate (as starting layer) and photovoltaic cell semiconductor layers (as target layer). The buffer structure is preferably formed with a specific thickness of at least 100 nm/pm, in particular at least 200 nm/pm. The buffer structure is preferably formed with a specific thickness less than 500 nm/pm, in particular less than 400 nm/pm.

Advantageously, all materials used in the metamorphic buffer structure have a band gap larger than the dominant photon energy. In particular, the material of the excess layer advantageously has a band gap larger than the dominant photon energy.

Advantageously, the metamorphic buffer structure is formed at least with multiple GaInP layers with a stepped increase in the indium content starting from the current conducting layer in the direction of the photovoltaic cell semiconductor layers, as described for example in France et al. (IEEE JOURNAL OF PHOTOVOLTAICS 1, Design Flexibility of Ultrahigh Efficiency Four-Junction Inverted Metamorphic Solar Cells, Ryan M. France, John F. Geisz, Ivan Garcia, Myles A. Steiner, William E. McMahon, Daniel J. Friedman, Tom E. Moriarty, Carl Osterwald, J. Scott Ward, Anna Duda, Michelle Young, and Waldo J. Olavarria).

It is also within the scope of the invention to form the metamorphic buffer structure with an indium content which increases continuously, in particular increases strictly monotonically, starting from the current conducting layer in the direction of the photovoltaic cell semiconductor layers.

During use of the photovoltaic cell, the metamorphic buffer structure lies on the side of the photovoltaic cell semiconductor layers facing the incident radiation. The band gap of the buffer layer of the metamorphic buffer structure is therefore larger by at least 10 meV, in particular at least 50 meV, preferably at least 100 meV, than the band gap of the absorber layer in order to achieve low absorption compared to that of the absorber layer. In particular, it is therefore advantageous that the band gaps of all layers of the metamorphic buffer structure, in particular all buffer layers and the excess layer, are larger by at least 10 meV, in particular at least 50 meV, preferably at least 100 meV, than the band gap of the absorber layer in order to achieve low absorption compared to that of the absorber layer.

In particular, it is therefore advantageous that the metamorphic buffer structure, preferably all layers of the metamorphic buffer structure, are formed so as to comprise aluminum.

It is therefore preferred that the buffer layer or the buffer layers of the metamorphic buffer structure are in the form of an AlGaInAs layer, in the form of a GaInP layer or formed from a mixed form of these compositions.

Advantageously, a tunnel diode layer structure is disposed between the current conducting layer and the photovoltaic semiconductor layers. Such a tunnel diode layer structure has the advantage that the polarity of the current conducting layer can be different from the polarity of the front-face-disposed layer of the photovoltaic layer structure. An example of a tunnel diode layer structure is described in France et al.

In an advantageous configuration, the tunnel diode layer structure is disposed between the current conducting layer and the metamorphic buffer structure. Here, advantageously, the metamorphic buffer structure is formed with a doping opposite to the current conducting layer. In particular, in this advantageous configuration, the current conducting layer is preferably n-doped and the metamorphic buffer structure is p-doped.

In an advantageous configuration, the tunnel diode layer structure is disposed between the metamorphic buffer structure and the photovoltaic cell semiconductor layers. Here, advantageously, the metamorphic buffer structure is formed with a doping of the doping type opposite to that of the layer of the photovoltaic cell semiconductor layers facing the tunnel diode layer. In particular, in this advantageous configuration, the metamorphic buffer structure is preferably n-doped.

In a further advantageous configuration, the tunnel diode layer structure is formed within the metamorphic buffer structure. In this embodiment, the metamorphic buffer structure has multiple layers, wherein at least one buffer layer of the metamorphic buffer structure is formed between the current conducting layer and the tunnel diode layer structure and at least one buffer layer of the metamorphic buffer structure is formed between the tunnel diode layer structure and the photovoltaic cell semiconductor layers. Advantageously, the buffer layer of the metamorphic buffer structure between the current conducting layer and the tunnel diode layer structure has a doping of the doping type of the current conducting layer, preferably an n-doping, and the buffer layer of the metamorphic buffer structure between the tunnel diode layer structure and the photovoltaic cell semiconductor layers has a doping of the opposite doping type.

The current conducting layer is preferably formed from at least one material or from combinations of materials from the group consisting of GaAs, InP, GaSb, Si, Ge, GaP, InAs, AlAs, AlP, InSb, AlSb. Preference is therefore given to providing a superstrate formed from at least one of the materials or combinations of materials from the group consisting of GaAs, InP, GaSb, Si, Ge, GaP, InAs, AlAs, AlP, InSb, AlSb. As described above, the current conducting layer preferably comprises the material GaAs and is preferably n-doped.

In an advantageous development of the method according to the invention, the method is designed for producing a plurality of photovoltaic cells, wherein, in a method step C following method step B, separation trenches which penetrate the photovoltaic cell semiconductor layers, but not the superstrate, are generated in order to form a plurality of photovoltaic cells separated by the separation trenches and, in a method step D, the semiconductor substrate is divided in order to singulate the photovoltaic cells.

In a further advantageous development of the method according to the invention, method steps C and D are carried out in a joint method step. In particular, it is advantageous to perform method steps C and D by means of plasma etching, preferably in situ, i.e., both method steps are performed in a reactor chamber without discharge of the semiconductor substrate between the method steps.

In a further advantageous development of the method according to the invention, the semiconductor substrate is divided in method step D by means of a saw blade-free separation process, preferably by means of laser-induced crystal fracture, in particular by means of "thermal laser separation" (TLS, as described in Zuhlke, 2009, "TLS-Dicing—An innovative alternative to known technologies" https://doi.org/10.1109/ASMC.2009.5155947) or by means of "stealth dicing" (SD, as described in F. Fukuyo, K. Fukumitsu and N. Uchiyama, "Stealth dicing technology and applications", *Proc. 6th Int. Symp. Laser Precision Microfabrication,* 2005 or Kumagai et al., 2007, IEEE T Semicond Manufac 20(3) https://doi.org/10.1109/TSM.2007.901849). Thus, the loss of semiconductor surface due to division (also called kerf loss) can be minimized.

In an advantageous development, method step C is dispensed with to save costs. In this advantageous development, the method is thus designed for producing a plurality of photovoltaic cells, wherein, in a method step D following method step B, the semiconductor substrate is divided in order to singulate the photovoltaic cells. Separation trenches according to the above-described method step C are not generated between method step B and method step D. Here, it is particularly advantageous that, in method step D, the semiconductor substrate is divided in method step D by means of a saw blade-free separation process, as described above, preferably by means of laser-induced crystal fracture, in particular by means of TLS or SD.

By doing away with method step C, cost savings are achieved. The use of a saw blade-free separation process in method step D, in particular TLS or SD, allows a better quality, in particular a better efficiency, of the photovoltaic cells, since undercuts of the edge surface in a method step C, which occur especially in wet-chemical mesa etching, are avoided.

The singulated photovoltaic cells thus have the advantages of the above-described photovoltaic cell according to the invention. In particular, the photovoltaic cells are preferably designed according to the photovoltaic cell according to the invention, in particular a preferred embodiment thereof.

Advantageously, in method step D, the semiconductor substrate is divided starting from the side of the superstrate facing away from the photovoltaic cells. This avoids or at least reduces impairment of the photovoltaic cell when the superstrate is divided.

The photovoltaic cell semiconductor layers form a photovoltaic semiconductor layer structure.

In a further advantageous development, the photovoltaic semiconductor layer structure is in the form of a stacked multi-photovoltaic cell. The individual subcells are advantageously connected monolithically to each other in series by means of tunnel diodes. A stacked multi-photovoltaic cell is known from Bett et al., 2008, DOI: 10.1109/PVSC.2008.4922910. Preferably, the photovoltaic semiconductor layer structure has a plurality of pn junctions, in particular at least two and more preferably at least three pn junctions.

In particular, it is advantageous to design the method as described above for singulating a plurality of photovoltaic cells, wherein each photovoltaic cell is in the form of a stacked multi-photovoltaic cell.

Advantageous embodiments and combinations of materials for the superstrate and the absorber layer of the photovoltaic cell semiconductor layers with interposition of a metamorphic buffer structure are listed in the following table, there being specified in each case the material and in parentheses the band gap in [eV], a preferred upper limit of the band gap or the preferred band gap range. Furthermore, some configurations are optimized for narrowband spectra with a specified dominant photon energy. The associated wavelength is additionally specified. The relationship between the specified photon energy in [nm] and the photon energy in [eV] arises from E=h*c/l with photon energy E [eV], Planck constant h [eV s], speed of light in vacuum c [nm/s] and wavelength 1 [nm].

| Superstrate (band gap [eV]) | Absorber layer (band gap [eV]) | Dominant photon energy [nm] |
|---|---|---|
| GaAs (1.42) | GaInAs or AlGaInAsP (<1.42) | |
| GaAs (1.42) | GaInAs (0.74 to 1.42, in particular 0.74 to 0.8) | 1550 |
| GaAs (1.42) | GaInAs (0.74 to 1.42, in particular 0.8 to 0.95) | 1310 |
| GaAs (1.42) | GaInAs (0.74 to 1.42, in particular 1.02 to 1.17) | 1064 |
| GaAs (1.42) | GaInAs (0.74 to 1.42, in particular 1.12 to 1.27) | 980 |
| Ge (0.67) | GaInAs (<0.67 eV) | |
| Si (1.12) | GaInAs, GaInAsP, AlGaInAsP (<1.12), | |
| Si (1.12) | GaInAs (0.74 to 0.8) | 1550 |
| Si (1.12) | GaInAs (0.8 to 0.95) | 1310 |
| Si (1.12) | GaInAs (1.02 to 1.17) | 1064 |
| GaSb (0.73) | AlGaInAsSb or GaInAsSb, (each <0.73) | |

It is particularly cost-effective and therefore advantageous to use a superstrate formed from silicon.

The photovoltaic cell semiconductor layers can have semiconductor layers known per se for forming a photovoltaic cell having an absorber layer formed from a direct semiconductor. In particular, it is advantageous that the photovoltaic cell semiconductor layers have one or more of the following layers, preferably all of them, especially preferably in the specified order starting from the superstrate:

a) a buffer layer;
b) a passivation layer (FSF, front surface field);
c) a p- or n-doped emitter layer;
d) a base layer oppositely doped to the emitter layer;
e) a further electrical passivation layer (BSF, back surface field);
f) a contact layer.

Depending on the configuration of the photovoltaic cell, the layer in which the significant energy component of the incident electromagnetic radiation is absorbed can be the emitter layer or the base layer. It is also within the scope of the invention that the emitter layer and base layer make a significant contribution to the absorption of the incident photons. The absorber layer can thus be the emitter layer or the base layer or the absorber layer is formed in multiple parts and comprises multiple layers, in particular emitter layer and base layer. In the case of a multipart absorber layer, the stated conditions with respect to the difference in the band gaps between the current conducting layer and the absorber layer can be applied to at least one sublayer of the multipart absorber layer; preference is given to applying the condition to the current conducting layer and each of the sublayers of the multipart absorber layer. In the case of a multipart absorber layer, the band gap of the current conducting layer is thus larger by at least 10 meV, in particular at least 50 meV, preferably at least 100 meV, than the band gap of at least one sublayer of the absorber layer. Preferably, in the case of a multipart absorber layer, the band gap of the current conducting layer is larger by at least 10 meV, in particular at least 50 meV, preferably at least 100 meV, than the band gap of each sublayer of the absorber layer.

The following table specifies exemplary embodiments of the superstrate and the photovoltaic semiconductor layers. The doping types are indicated by the prefix n- (n-doping) or p- (p-doping) in each case. Furthermore, the doping concentration and the thickness of the layer are specified. Furthermore, "[absorber layer]" is used to indicate which layer makes a significant contribution to absorption in the respective configuration and is thus referred to as absorber layer (or part of a multipart absorber layer):

| Layer | Exemplary embodiment | Modification 1 |
|---|---|---|
| Superstrate | n-GaAs | n-GaAs |
| Buffer layer | n-AlGaInAsP [1]) | n-AlGaInAsP [1]) |
| FSF | $Ga_{0.21}In_{0.79}P$<br>n-2 × $10^{18}$ $cm^{-3}$<br>100 nm | $Ga_{0.21}In_{0.79}P$<br>n-2 × $10^{18}$ $cm^{-3}$<br>100 nm |
| Emitter | $Ga_{0.71}In_{0.29}As$<br>n-1 × $10^{18}$ $cm^{-3}$<br>150 nm<br>[absorber layer] | $Ga_{0.71}In_{0.29}As$<br>n-1 × $10^{17}$ cm-3<br>1500 nm<br>[absorber layer] |
| Base | $Ga_{0.71}In_{0.29}As$<br>p-1 × $10^{17}$ $cm^{-3}$<br>2500 nm<br>[absorber layer] | $Al_{0.3}Ga_{0.41}In_{0.29}As$<br>p-1 × $10^{18}$ $cm^{-3}$<br>200 nm |
| BSF | $Al_{0.3}Ga_{0.41}In_{0.29}As$<br>p-2 × $10^{18}$ $cm^{-3}$<br>50 nm | $Al_{0.6}Ga_{0.11}In_{0.29}As$<br>p-2 × $10^{18}$ $cm^{-3}$<br>50 nm |
| Contact layer | $Al_{0.1}Ga_{0.61}In_{0.29}As$<br>p-6 × $10^{18}$ $cm^{-3}$<br>300 nm | $Al_{0.3}Ga_{0.41}In_{0.29}As$<br>p-6 × $10^{18}$ $cm^{-3}$<br>300 nm |

[1]) The buffer layer AlGaInAsP is in the form of a metamorphic buffer layer, with increasing In content of 0.49-0.83 starting from the superstrate.

The photovoltaic semiconductor layers are preferably applied by means of epitaxy, especially preferably by means of CVD (chemical vapor deposition). This means that apparatus commercially available per se can be used to carry out such processes.

It is especially advantageous to use metal organic chemical vapor deposition (MOCVD), in particular metal organic chemical vapor phase epitaxy (MOVPE), to apply the photovoltaic semiconductor layers.

In a further advantageous embodiment, all or some of the photovoltaic semiconductor layers are applied by means of one of the methods molecular beam epitaxy (MBE), VPE (vapor phase epitaxy) or HVPE (hydride vapor phase epitaxy).

Advantageously, a suitable nucleation layer is first deposited on the surface of the semiconductor substrate in epitaxial deposition. This is especially advantageous in the case of heteroepitaxy when the epitaxized layers are composed of a different material from the semiconductor substrate, such as in the case of GaP deposition on a Si substrate.

The above- and below-mentioned values for band gap differences between the current conducting layer and the absorber layer and the values for the band gap of a semiconductor, in particular the current conducting layer, are based on standardized ambient conditions at a temperature of 25° C. The band gap of a semiconductor is dependent on the temperature of the semiconductor, and so different band gap values are present under operating conditions at a different temperature, especially when using a photovoltaic cell produced by means of the method according to the invention. The dependence of band gap on semiconductor temperature is described in Vurgaftman, J. R. Meyer, and L. R. Ram-Mohan, "Band parameters for III-V compound semiconductors and their alloys," J. Appl. Phys. 89, 5815 (2001).

When using the photovoltaic cells produced by means of the method according to the invention, operating temperatures distinctly above the aforementioned standardized ambient conditions may be present.

BRIEF DESCRIPTION OF THE DRAWINGS

Further advantageous features and embodiments are explained below on the basis of exemplary embodiments and the figures, where.

DETAILED DESCRIPTION

All the figures show schematic illustrations that are not true to scale. The same reference signs in the figures denote elements that are the same or have the same effect.

Figure 1A:
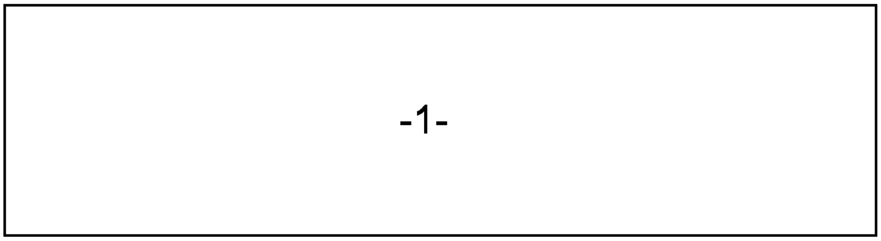
FIGS. 1A-1C show method steps of an exemplary embodiment of a method according to the invention.
Figure 1B:
Figure 1C:
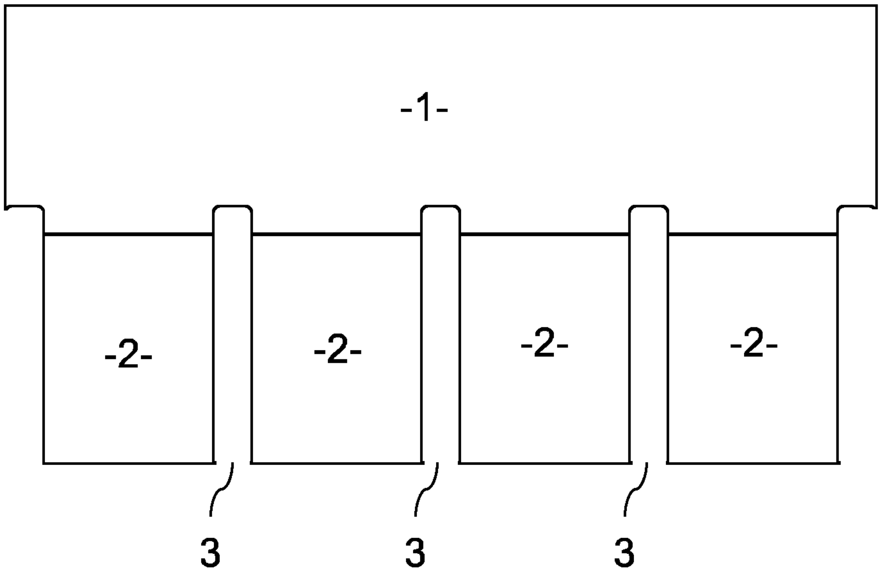

FIGS. 1A-1C schematically show method steps of an exemplary embodiment of a method according to the invention for producing a photovoltaic cell for converting electromagnetic radiation into electrical energy.

A method step A comprises providing a superstrate 1 in the form of a semiconductor substrate. In the present case, the superstrate 1 is in the form of an indium phosphite substrate (InP) having a band gap of 1.35 eV. This is shown in FIG. 1A.

A method step B comprises applying photovoltaic cell semiconductor layers 2 for forming at least one photovoltaic cell to a rear face of the superstrate indirectly or directly, wherein the photovoltaic cell semiconductor layers have at least one absorber layer formed from a direct semiconductor. This is shown in FIG. 1B.

The rear face of the superstrate is the side facing away from the radiation source during use of the photovoltaic solar cell and is accordingly shown as bottom-lying in the figures. However, it is within the scope of the invention to use the superstrate with a top-lying rear face during production, and so the process steps are simplified by applying the photovoltaic cell semiconductor layers to the superstrate from above.

The superstrate is in the form of a current conducting layer and, in the present case, has n-doping with the dopant Si and a doping concentration of $1\times10^{17}$ cm$^{-3}$. The thickness of the superstrate is 20 μm in the present case. In an alternative exemplary embodiment, the current conducting layer has p-doping with the dopant Zn.

The photovoltaic cell semiconductor layers 2 are formed with an electrically conductive connection to the current conducting layer, i.e., the superstrate 1, and so charge carriers can be conducted away from the photovoltaic cell on a front face of the superstrate 1.

The absorber layer of the photovoltaic cell semiconductor layers is formed from a direct semiconductor, and is in the form of an InGaAs layer having a band gap of 0.74 eV in the present case. The band gap of the current conducting layer is thus larger by at least 50 meV, by 0.61 eV in the present case, than the band gap of the absorber layer.

The structure shown schematically in FIG. 1B can already be used as a photovoltaic cell, though it is advantageous for metallic contacting structures for conducting away the charge carriers to be additionally disposed on the front face and rear face, as will be further explained below.

Superstrate 1 and photovoltaic cell semiconductor layers 2 are monolithically formed. In the present exemplary embodiment, the photovoltaic cell semiconductor layers are epitaxially applied to the superstrate 1.

In an advantageous development of the above-described exemplary embodiment, the method is designed for producing a plurality of photovoltaic cells, wherein, in a method step C, separation trenches 3 which penetrate the photovoltaic cell semiconductor layers, but not the superstrate 1, are generated. The separation trenches 3 are preferably formed by means of etching, by means of wet-chemical etching in the present case. This state following formation of the separation trenches is shown in FIG. 1C.

A subsequent method step D comprises dividing the superstrate 1 in order to singulate the photovoltaic cells. Here, the superstrate 1 is divided starting from the side of the superstrate facing away from the superstrate.

In this modification of the exemplary embodiment, a plurality of photovoltaic cells can thus be produced cost-effectively, each singulated photovoltaic cell having a segment of the superstrate 1 on the front face.

Figure 2:
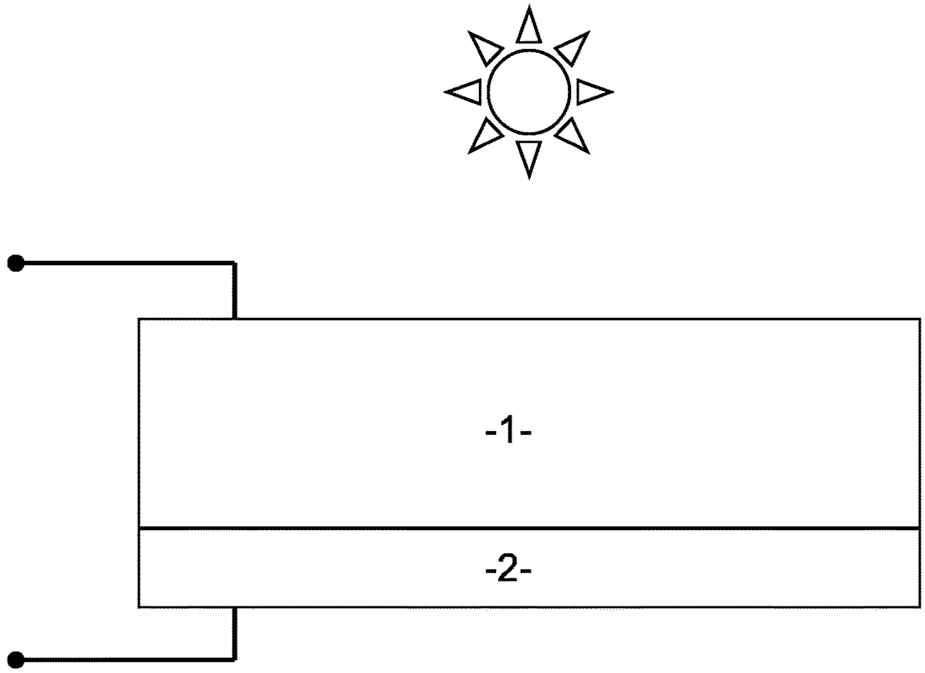
FIG. 2 and FIG. 3 both show an exemplary embodiment of a photovoltaic cell produced by means of the method according to the invention.

FIG. 2 schematically shows an exemplary embodiment of a photovoltaic cell produced by means of the method according to the invention, having superstrate 1 and photovoltaic cell semiconductor layers 2.

Figure 3:
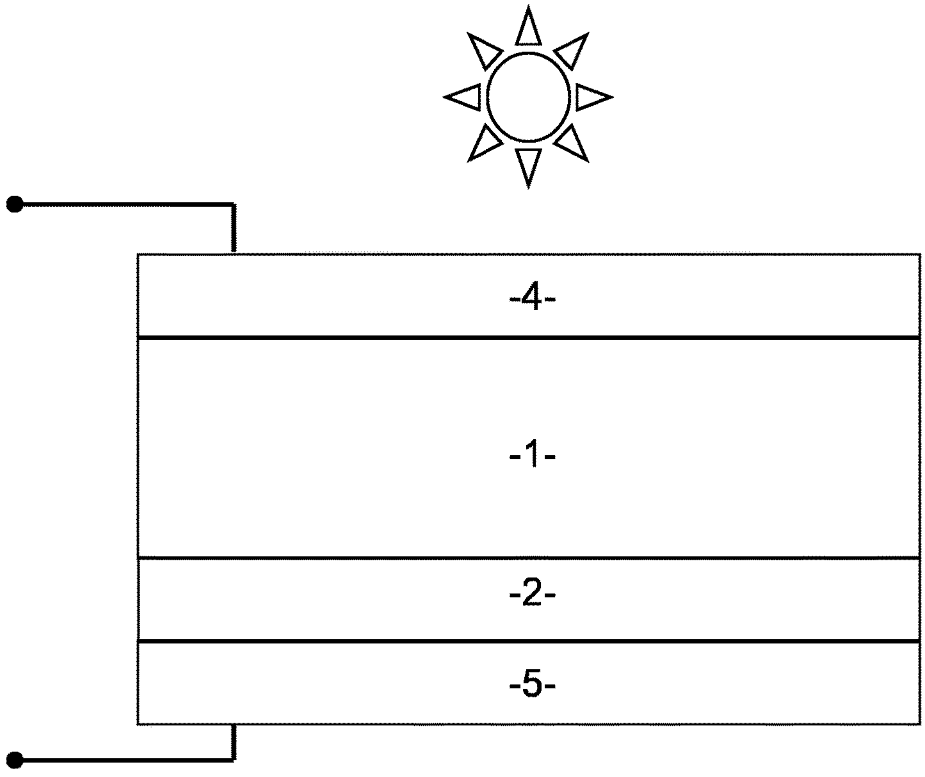

The radiation source is shown schematically by the sun symbol (and in FIG. 3). The method according to the invention is suitable for producing photovoltaic cells for use as a solar cell for converting sunlight into electrical energy. In particular, the method is suitable, however, for forming photovoltaic cells for use in a transmission system for energy and/or signal transmission by means of electromagnetic radiation. Such a transmission system has a radiation source, in particular a narrowband radiation source such as a diode or a laser, the radiation of which is converted by the photovoltaic cell into electrical energy or an electrical signal.

As shown in FIG. 2, contacting typically occurs on the front face of the superstrate 1 and on the rear face of the photovoltaic cell semiconductor layers 2, there optionally being additional contacting layers and/or contacting elements disposed on the front face and/or on the rear face.

In the exemplary embodiments described in relation to the figures, a metamorphic buffer structure for gradual adjustment of the lattice constant is formed in each case between superstrate 1 and the photovoltaic cell semiconductor layers 2. The metamorphic buffer structure is in the form of an n-doped AlGaInAsP buffer layer, with increasing In content of 0.49-0.83 starting from the superstrate.

In a further advantageous development, a tunnel diode layer structure is disposed between superstrate 1 and the photovoltaic cell semiconductor layers 2. An example of such a tunnel diode layer structure is a layer sequence of very highly doped semiconductors that form a p-n junction such as: 30 nm p$^{++}$ Al0.3Ga0.7As (doping: $1\times10^{19}$ cm$^{-3}$) and 30 nm n$^{--}$ GaAs p$^{++}$ Al0.3Ga0.7As (doping: $1\times10^{19}$ cm$^{-3}$). Such an example of a tunnel diode layer structure is described in Wheeldon et al. PROGRESS IN PHOTOVOLTAICS: RESEARCH AND APPLICATIONS, Prog. Photovolt: Res. Appl. 2011; 19:442-452, published online 18 Nov. 2010 in Wiley Online Library (wileyonlinelibrary.com). DOI: 10.1002/pip. 1056. Here, the tunnel diode is disposed between superstrate 1 and metamorphic buffer structure.

Advantageously, as described above, a metallic front-face contacting structure 4 is formed on a front face of the superstrate 1, which contacting structure is disposed on the front face of the superstrate 1 indirectly or directly and is electrically conductively connected to the superstrate 1. Furthermore, it is advantageous that a rear-face structure 5 is disposed on the rear face of the photovoltaic cell semiconductor layers 2.

The rear-face structure 5 advantageously comprises a metallic rear-face contacting structure, for conducting away charge carriers on the rear face of the photovoltaic cell. Such an exemplary embodiment is shown in FIG. 3.

As described at the start, the formation of the superstrate 1 as a current conducting layer compared to previously known photovoltaic cells means that it is possible to achieve a reduction in the degree of coverage of the front face of the superstrate 1 by the front-face contacting structure 4. FIGS. 4A-4G show plan views of various exemplary embodiments of metallic front-face contacting structures 4.

The exemplary embodiments in FIGS. 4B, 4C, 4D, 4E, and 4G each have a busbar with a peripheral thick black line. In the case of use of the photovoltaic cell in a transmission system, the transmission system is designed in such a way that the radiation of the radiation source substantially impinges within the region peripherally delimited by the busbar, and so the busbar causes no shading or only negligible shading of the radiation. The busbar thus defines a receiving region for receiving incident electromagnetic radiation. Within the receiving region, there can be no disposition of a metallic contacting structure as in exemplary embodiment of FIG. 4E, or what are disposed are contacting fingers that are considerably thinner compared to the busbar, as in exemplary embodiments of FIGS. 4B, 4C, 4D, and 4G. This results in a low degree of coverage of the front-face contacting structure in the receiving region.

Figure 4A:
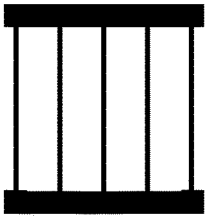
FIGS. 4A-4G show exemplary embodiments of metallic front-face contacting structures of photovoltaic cells produced by means of the method according to the invention
Figure 4B:
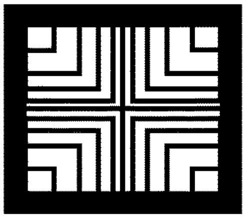
Figure 4C:
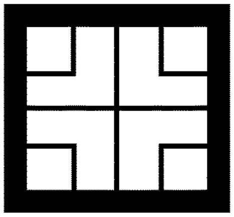
Figure 4D:
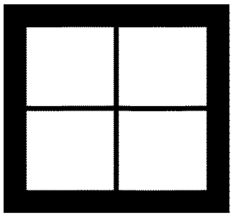
Figure 4E:
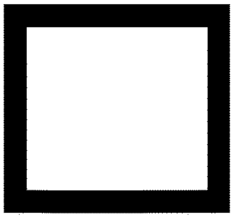
Figure 4F:
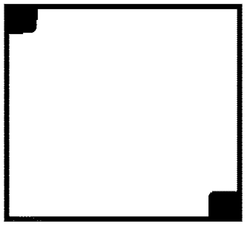
Figure 4G:
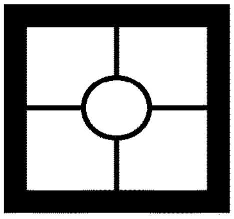

In exemplary embodiment shown in FIG. 4F, the front-face contacting structure merely has two metallic contacting surfaces (contacting pads) which are formed at opposite corners and which are connected by a thin, peripheral square metallization. The exemplary embodiment of FIG. 4A shows a simple configuration known per se having two opposite busbars, between which are disposed multiple parallel metallic contacting fingers perpendicular to busbars.

In an advantageous development of the photovoltaic cell shown in FIG. 3, the rear-face contact structure 5 has a mirror structure for at least partial reflection of the electromagnetic radiation. The mirror structure is thus disposed on the rear face of the photovoltaic cell semiconductor layers facing away from the superstrate 1.

In a simple configuration, the rear-face contact structure 5 consists of a metal layer, in particular of one of the materials Ag, Au.

In an advantageous development, the rear-face structure 5 is formed with a metal layer and a contact and mirror layer disposed between the metal layer and photovoltaic cell semiconductor layers 2. The contact and mirror layer is preferably in the form of a transparent conductive oxide (TCO).

In a further advantageous development, the rear-face structure 5 is formed with a metal layer and a dielectric interlayer ("spacer") disposed between the metal layer and photovoltaic cell semiconductor layers 2. The dielectric interlayer is preferably formed from one of the following combinations of materials $MgF_2$, AlOx, ITO, TiOx, TaOx, ZrO, SiN, SiOx, PU. In order to form an electrical connection between the metal layer and the photovoltaic cell semiconductor layers 2, the dielectric interlayer is preferably structured by penetration of the dielectric interlayer at a plurality of points by metal connections, each of which is electrically conductively connected to, firstly, the metal layer and, secondly, the photovoltaic cell semiconductor layers.

Figure 5A:
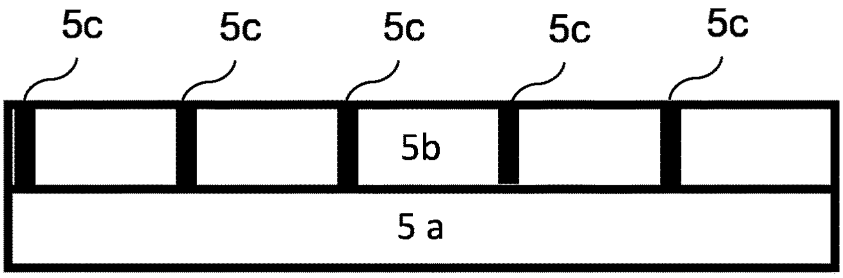
FIGS. 5A-5B show partial views of layer structures on the rear face of further exemplary embodiments of photovoltaic cells produced by means of the method according to the invention.

This is shown schematically in FIG. 5A: the rear-face structure 5 has a metal layer 5*a*, and disposed on the side of the metal layer 5*a* facing the photovoltaic cell semiconductor layers is a dielectric interlayer 5*b*, which is a silicon oxide layer in the present case. The silicon oxide layer is electrically nonconductive and is therefore penetrated by a plurality of metal connectors 5*c* in order to electrically conductively connect the metal layer 5*a* to the photovoltaic cell semiconductor layers 2.

Figure 5B:
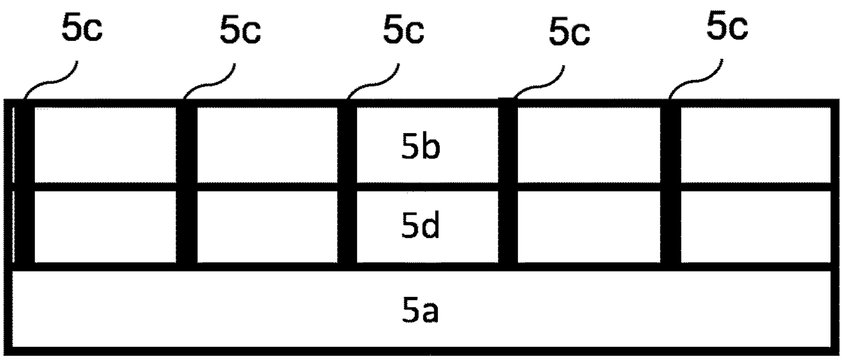

An advantageous development of such a rear-face structure 5 is shown in FIG. 5B:

Disposed between the dielectric interlayer 5*b* and the metal layer 5*a* is a conductive mirror layer 5*d* which is likewise penetrated by the metal connectors 5*c*. The metal layer 5*a* is formed from silver or, in an alternative configuration, from gold. As a result, high optical reflection is achieved. In order to achieve contacting of the semiconductor layers with a low contact resistance, the metal connectors are formed from a different metal than the mirror layer. In the present case, the metal connectors are formed from a combination of palladium, zinc and gold.

In a modification of the exemplary embodiment shown in FIG. 5B, the interlayer 5*b* is omitted, and so the rear-face structure 5 has only the metal layer 5*a* and the mirror layer 5*d*, which is penetrated by the metal connectors 5*c*.

Figure 6A:
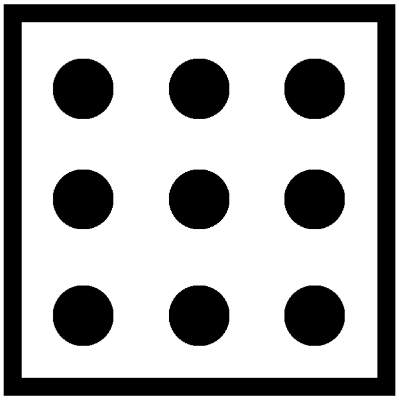
FIGS. 6A-6B show schematic views of the disposition of contacting points of the illustrations according to FIGS. 5A-5B.
Figure 6B:
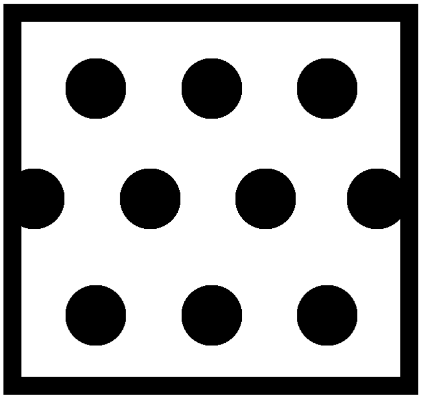

FIGS. 6A and 6B show a plan view of the rear face of the rear-face structures 5 according to FIGS. 5A and 5B. The positions at which the metal connectors 5*c* impinge on the metal layer 5*a* are marked by spots.

In the exemplary embodiment according to FIG. 6A, the metal connectors 5*c* are disposed in a regular manner on the crossing points of a square grid. In the exemplary embodiment according to FIG. 6B, the metal connectors 5*c* are disposed hexagonally.

LIST OF REFERENCE SIGNS

1 Superstrate
2 Photovoltaic cell semiconductor layers
3 Separation trenches
4 Front-face contacting structure
5 Rear-face structure
5*a* Metal layer
5*b* Interlayer
5*c* Metal connector
5*d* Mirror layer

The invention claimed is:

1. A method for producing at least one photovoltaic cell for converting electromagnetic radiation into electrical energy, the method comprising the following steps:

A. providing a superstrate formed as a semiconductor substrate;

B. applying photovoltaic cell semiconductor layers for forming at least one photovoltaic cell to a rear face of the superstrate indirectly or directly, wherein the photovoltaic cell semiconductor layers have at least one absorber layer formed from a direct semiconductor;

wherein the superstrate is in the form of a current conducting layer having a thickness greater than 10 μm and, in method step B, the method further comprises forming the photovoltaic cell semiconductor layers with an electrically conductive connection to the current conducting layer, disposing a metamorphic buffer structure having one or more buffer layers between the current conducting layer and the photovoltaic cell semiconductor layers, and wherein a band gap of the current conducting layer and a band gap of the buffer layer is larger by at least 10 meV than a band gap of the absorber layer.

2. The method as claimed in claim 1, further comprising monolithically forming the current conducting layer, the metamorphic buffer structure and the photovoltaic cell semiconductor layers on the superstrate.

3. A transmission system formed by the method as claimed in claim 1, wherein the superstrate has a band gap which is larger than a specified dominant photon energy and the absorber layer is formed with a band gap which is smaller than the specified dominant photon energy.

4. The method as claimed in claim 1, wherein the metamorphic buffer structure is formed with a band gap which decreases starting from the current conducting layer in a direction of the photovoltaic cell semiconductor layers.

5. The method as claimed in claim 1, further comprising forming a metallic front-face contacting structure on a front face of the superstrate, said contacting structure is disposed on the front face of the superstrate indirectly or directly and is electrically conductively connected to the superstrate.

6. The method as claimed in claim 5, wherein the superstrate has a receiving region for receiving incident electromagnetic radiation and a degree of coverage of the front-face contacting structure in the receiving region is less than 5%.

7. The method as claimed in claim 6, wherein the receiving region is formed so as to cover a circular area having a diameter in a range from 0.1 mm to 10 mm.

8. The method as claimed in claim 1, further comprising providing a mirror structure for at least partial reflection of the electromagnetic radiation indirectly or directly on a rear face of the photovoltaic cell semiconductor layers facing away from the superstrate, and the mirror structure is electrically conductive.

9. The method as claimed in claim 1, further comprising providing a tunnel diode layer structure between the superstrate and the photovoltaic semiconductor layers.

10. The method as claimed in claim 1, further comprising forming the superstrate from at least one of the materials or combinations of materials from the group consisting of: GaAs, InP, GaSb, Si, Ge, GaP, InAs, AlAs, AlP, InSb, and AlSb.

11. The method as claimed in claim 1, wherein for producing a plurality of photovoltaic cells, in a method step D following method step B, the method further comprises dividing the superstrate in order to singulate the photovoltaic cells.

12. The method as claimed in claim 11, wherein, in method step D, the superstrate is divided starting from a side of the superstrate facing away from the photovoltaic cell semiconductor layers.

13. The method as claimed in claim 12, wherein, in method step D, the superstrate is divided by a separation method based on laser-induced crystal fracture.

14. The method as claimed in claim 13, wherein, between method step B and method step D, no separation trenches are formed.

15. The method as claimed in claim 1, wherein the photovoltaic cell semiconductor layers are comprise a stacked multi-photovoltaic cell.

16. The method of claim 1, further comprising providing the at least one photovoltaic cell in a transmission system for at least one of energy or signal transmission by electromagnetic radiation, having at least one radiation source for generating electromagnetic radiation and one of the photovoltaic cells for converting incident electromagnetic radiation into electrical energy.

17. The method as claimed in claim 8, further comprising forming the mirror structure from one element or multiple elements from the group consisting of:

a metal layer, in particular silver layer or gold layer;

a dielectric layer structure having at least one dielectric layer and at least one metal layer; and a Bragg mirror.

18. The method as claimed in claim 11, further comprising in a method step C between method step B and method step D, generating separation trenches which penetrate the photovoltaic cell semiconductor layers, but not the superstrate, in order to form a plurality of photovoltaic cells separated by the separation trenches.

* * * * *